(12) United States Patent
Zafar

(10) Patent No.: US 12,045,193 B2
(45) Date of Patent: Jul. 23, 2024

(54) DYNAMIC PROCESSING MEMORY

(71) Applicant: Atif Zafar, Carmel, IN (US)

(72) Inventor: Atif Zafar, Carmel, IN (US)

(73) Assignee: Atif Zafar, Carmel, IN (US)

( * ) Notice: Subject to any disclaimer, the term of this patent is extended or adjusted under 35 U.S.C. 154(b) by 268 days.

(21) Appl. No.: 17/369,021

(22) Filed: Jul. 7, 2021

(65) Prior Publication Data

US 2022/0013153 A1   Jan. 13, 2022

Related U.S. Application Data

(60) Provisional application No. 63/048,752, filed on Jul. 7, 2020.

(51) Int. Cl.
*G06F 15/78* (2006.01)
*G06F 7/501* (2006.01)
*G06F 7/523* (2006.01)

(52) U.S. Cl.
CPC .......... *G06F 15/7821* (2013.01); *G06F 7/501* (2013.01); *G06F 7/523* (2013.01)

(58) Field of Classification Search
CPC ......... G06F 15/7821; G06F 7/544; G06F 1/02
See application file for complete search history.

(56) References Cited

U.S. PATENT DOCUMENTS

| 9,432,298 | B1 | 8/2016 | Smith | |
|---|---|---|---|---|
| 11,403,111 | B2 * | 8/2022 | Yudanov | G06F 9/3853 |
| 11,500,960 | B2 * | 11/2022 | Wang | G06N 3/063 |
| 2009/0119484 | A1 * | 5/2009 | Mohl | G06F 30/34 |
| | | | | 712/201 |
| 2010/0079600 | A1 | 4/2010 | Silverbrook | |
| 2016/0248631 | A1 | 8/2016 | Duchesneau | |
| 2017/0345481 | A1 * | 11/2017 | Hush | G11C 11/4093 |

(Continued)

OTHER PUBLICATIONS

Jingcheng Wang, Xiaowei Wang, Charles Eckert, Arun Subramaniyan, Reetuparna Das, David Blaauw, Dennis Sylvester, "A Compute SRAM with Bit-Serial Integer/Floating-Point Operations for Programmable In-Memory Vector Acceleration", March, IEEE, pp. 224-226 (Year: 2019).*

(Continued)

*Primary Examiner* — Courtney P Spann
(74) *Attorney, Agent, or Firm* — Taft Stettinius & Hollister LLP

(57) ABSTRACT

Embodiments of the present invention provide a method for incorporating a dynamic memory block and a configurable processor controller to enable computational processing and memory storage. The method includes storing data elements with each data element stored in a corresponding memory cell. The method also includes executing a computation operation when the storage device of the data elements is adjusted thereby triggering the computation operation. The method also includes transitioning the memory cells from the storage device to the computation device by adjusting the storage of data elements by the memory cells to execute the computation operation. The method also includes transitioning the memory cells from the computation device to the storage device by maintaining the storage of data elements by the memory cells in a static state thereby preventing storage of data elements by the memory cells from being adjusted.

20 Claims, 3 Drawing Sheets

(56) References Cited

U.S. PATENT DOCUMENTS

Figure 1:
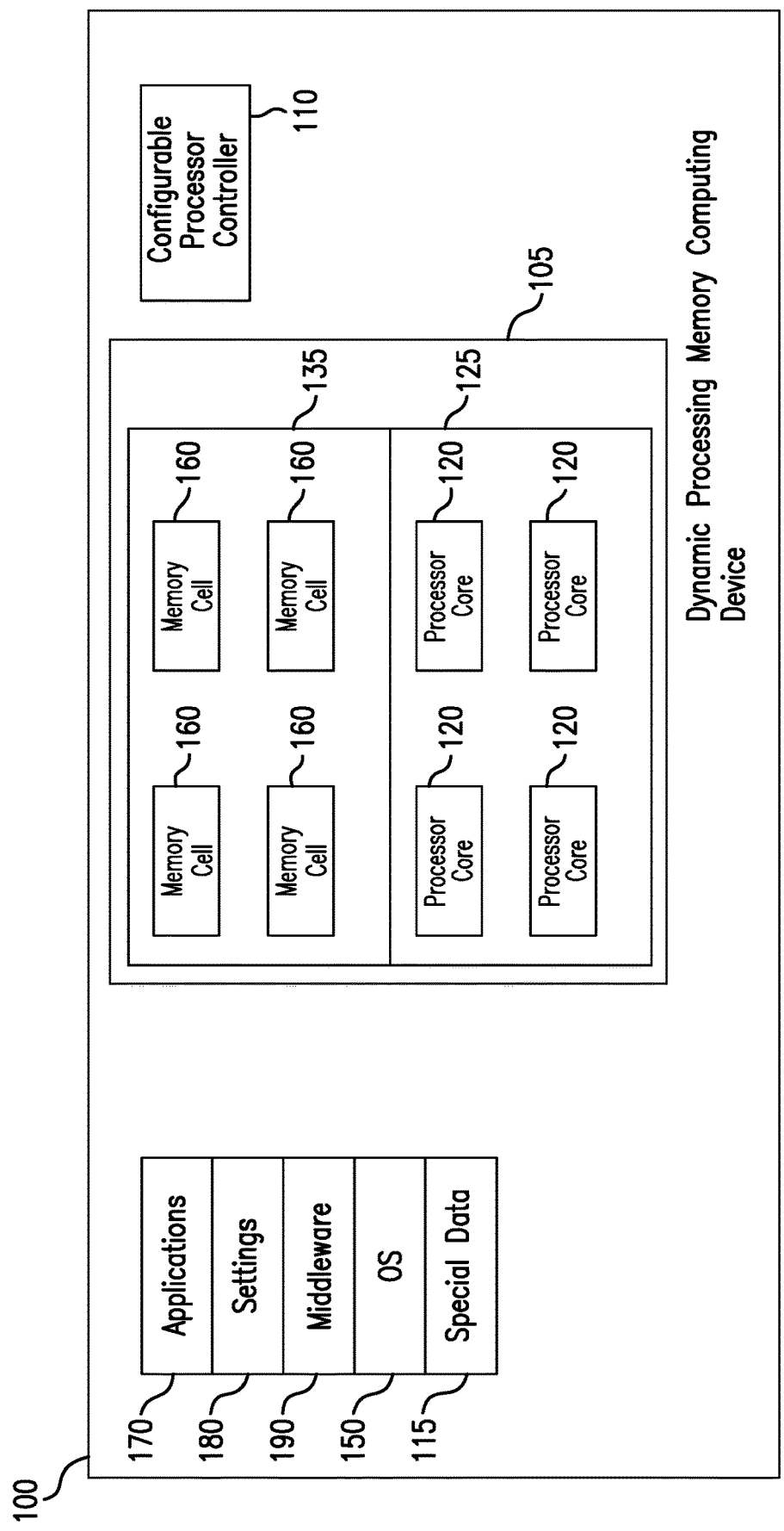

| | | |
|---|---|---|
| 2018/0211697 A1 | 7/2018 | Teh |
| 2021/0181828 A1* | 6/2021 | Chawla ............. G05F 3/24 |
| 2021/0271597 A1* | 9/2021 | Verma ............. G06N 3/045 |

OTHER PUBLICATIONS

Akshay Krishna Ramanathan, Gurpreet S Kalsi, Srivatsa Srinivasa, Tarun Makesh Chandran, Kamlesh R Pillai, Om J Omer, Vijaykrishnan Narayanan and Sreenivas Subramoney, "Look-Up Table based Energy Efficient Processing in Cache Support for Neural Network Acceleration", Nov. 11, IEEE, pp. 88-101 (Year: 2020).*

International Search Report; International Searching Authority; International Patent Application No. PCT/IB2019/001278; Jul. 28, 2020; 2 pages.

Written Opinion of the International Searching Authority; International Searching Authority; International Patent Application No. PCT/IB2019/001278; Jul. 28, 2020; 16 pages.

\* cited by examiner

DYNAMIC PROCESSING MEMORY

CROSS-REFERENCE TO RELATED APPLICATIONS

This application claims the benefit of U.S. Provisional Patent Application No. 63/048,752 filed on Jul. 7, 2020, the disclosure of which is incorporated by reference in its entirety.

BACKGROUND

Field of the Invention

The present invention generally relates to computing systems. More particularly, the present invention is directed to architecture and methods for providing computational processing and memory storage by memory.

Related Art

Moore's Law is the observation that the quantity of transistors included in integrated circuits grows significantly as time progresses. Essentially, Moore's Law indicates that the size of transistors continues to decrease as time progresses thereby enabling significant growth in the quantity of transistors in integrated circuits as time progresses. However, in the last couple of years, Moore's law has slowed significantly in that the decrease in size of transistors has plateaued thereby significantly slowing the growth in the quantity of transistors on integrated circuits. In response to the plateauing of the decrease in transistor size, the processor industry has compensated by increasing the quantity of conventional processors positioned on a conventional chip in order to continue to improve processing.

In increasing the quantity of conventional processors positioned on a conventional chip to continue to improve the processing capabilities of the conventional chip, the conventional processors still have to access conventional memory to be able to execute any computations. In increasing the quantity of conventional processors positioned on a chip, the processor industry is also increasing the quantity of conventional memory access technologies, such as conventional caches, positioned on the conventional chip. In doing so, a greater portion of die space for the conventional chip is devoted to conventional memory access technologies.

In conventional approaches, the conventional processors interact with conventional memory positioned off-chip. In doing so, the overall performance of the conventional processor system slows as the data is transferred between the conventional processors and the conventional memory positioned off-chip from the conventional processors. Further, the amount of power consumed by the conventional processor system increases by transferring the data off-chip as well as the cost of the conventional processor system increases.

The incorporation of a conventional Graphics Processing Unit (GPU) into the conventional processor system further increases the amount of power consumed by the conventional processor system as well as the cost. The conventional GPU is limited to rendering each object into triangles in creating the graphical image for display. Regardless of the shape of the object to be displayed, the conventional GPU renders the object into triangles via the hardware incorporated into the conventional GPU. The hardware as well as the conventional GPU being positioned off-chip significantly increases the power consumed by the conventional processor system as well as the cost of the conventional processor system.

The answer to the plateauing of Moore's Law by the processor industry as well as the increased reliance on conventional GPUs has resulted in a significant increase in the power consumed by conventional processor systems as well as an increase in cost. In doing so, the conventional memory continues to be maintained off-chip from the conventional processors thereby having an impact on the performance of the conventional processor systems.

BRIEF SUMMARY

What is needed, therefore, is a method and a system for incorporating a dynamic memory block with a configurable processor controller, such as a Field Programmable Gate Array (FPGA) to enable computational processing and memory storage from the dynamic memory block.

In an embodiment, a system incorporates a dynamic memory block and a configurable processor controller to enable computational processing and memory storage via the dynamic memory block and the configurable processor controller. The system includes a plurality of memory cells included in the dynamic memory block that is configured to store a plurality of data elements with each data element stored in a corresponding memory cell. The memory cells included in the dynamic memory block are configured to execute a computation operation when the storage of the data elements is adjusted thereby triggering the computation operation and enabling the memory cells to function as a memory storage device and a computation device. The configurable processor controller is configured to transition the memory cells from the storage device to the computation device by adjusting the storage of data elements by the memory cells to execute the computation operation. The configurable processor controller is also configured to transition the memory cells from the computation device to the storage device by maintaining the storage of data elements by the memory cells in a static state thereby preventing storage of data elements by the memory cells from being adjusted.

In an embodiment, a method incorporates a dynamic memory block and a configurable processor controller to enable computational processing and memory storage via the dynamic memory block and the configurable processor controller. A plurality of memory cells store a plurality of data elements with each data element stored in each corresponding memory cell. The memory cells execute a computation operation when the storage of the data elements is adjusted thereby triggering the computation operation and enabling the memory cells to function as a memory storage device and a computation device. The configurable processor controller transitions the memory cells from the storage device to the computation device by adjusting the storage of data elements by the memory cells to execute the computation operation. The configurable processor controller transitions the memory cells from the computation device to the storage device by maintaining the storage of data elements by the memory cells in a static state thereby preventing storage of data elements by the memory cells from being adjusted.

Additional features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrational purposes only. Additional embodiments will be apparent to those skilled in the relevant art(s) based on the teachings combined herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the pertinent art to make and use the present invention. Various embodiments of the present invention are described below with reference to the drawings, wherein like reference numerals are used to refer to like elements throughout.

Figure 2:
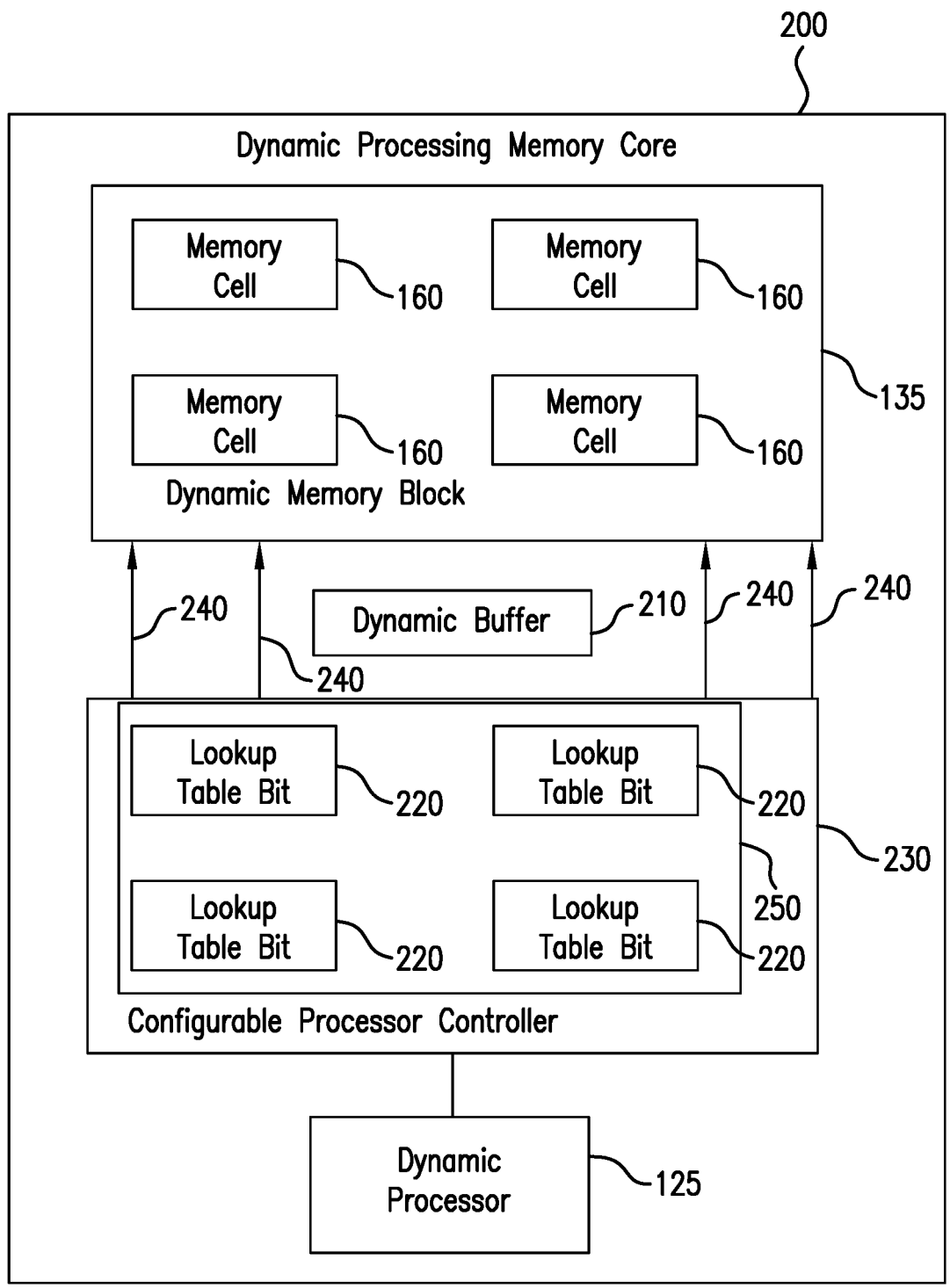
Figure 3:
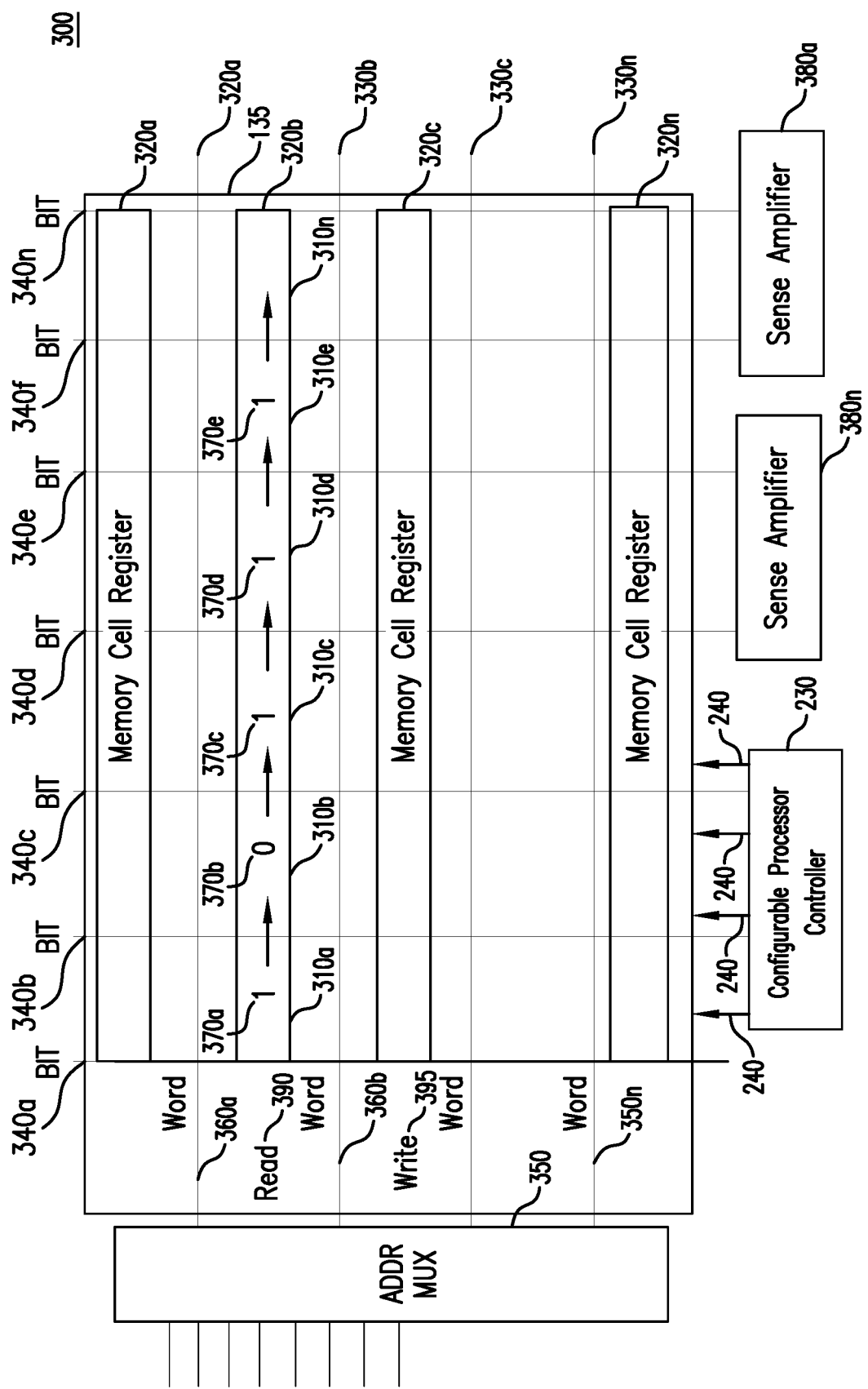

FIG. 1 shows a block diagram of an exemplary dynamic processing memory computing device;

FIG. 2 is a block diagram of an exemplary dynamic processing memory core that provides further detail with regard to how dynamic processing memory core operates as both a processing device and a memory storage device; and FIG. 3 is a block diagram of an exemplary dynamic processing memory core that provides further detail with regard to how dynamic memory block operates as a memory storage device as well as execute computer operations.

DETAILED DESCRIPTION

The term "embodiment of the present invention" does not require that all embodiments of the present invention included the discussed feature, advantage or mode of operation. Alternate embodiments may be devised without departing from the scope of the present invention, and well-known elements of the present invention may not be described in detail or may be omitted so as not to obscure the relevant details of the present invention. In addition, the terminology used herein is for the purpose of describing particular embodiments only and is not intended to be limiting of the present invention. For example, as used herein, the singular forms "a", "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

System Overview

FIG. 1 is a block diagram of an exemplary dynamic processing memory computing device 100 that includes a configurable processor controller 110, a dynamic processing memory core 105, applications 170, settings 180, a middleware layer 190, an operating system 150, and data 115 not associated with applications 170. Dynamic processing memory core 105 includes a dynamic processor 125 and a dynamic memory block 135. Dynamic processor 125 includes one or more processor cores 120. Dynamic memory block 135 includes one or more memory cells 160.

Dynamic processing memory computing device 100 may be a device that is capable of electronically communicating with other devices. Examples of dynamic processing memory computing device 100 may include a mobile telephone, a smartphone, a workstation, a portable computing device, other computing devices such as a laptop, or a desktop computer, cluster of computers, set-top box, a video player, an audio player, a product inventory checking system, and/or any other suitable electronic device that will be apparent to those skilled in the relevant art(s) without departing from the spirit and scope of the disclosure.

In an embodiment, multiple modules may be implemented on the same computing device. Such a computing device may include software, firmware, hardware, or a combination thereof. Software may include one or more applications or an operating system. Hardware can include, but is not limited to, a processor, a memory, and/or graphical user interface display.

Dynamic processing memory computing device 100 can include (not shown) one or more control processors, field programmable gate arrays (FPGA), application specific integrated circuits (ASIC), and/or digital signal processors (DSP). Dynamic processing memory computing device 100, for example, executes the control logic including operating system 150, applications 170, configurable processor controller 110, dynamic processor 125 that control operation of dynamic processing memory computing device 100. Dynamic processing memory computing device 100 may include one or more single or multi-core computing units.

Dynamic memory block 135 may include non-volatile memory as well as volatile memory. Volatile memory may include random access memory (RAM), dynamic random access memory (DRAM), static random access memory (SRAM), or other such memories positioned on the same chip that is separate from non-volatile memory also positioned on the same chip.

Volatile memory may store processing logic instructions, constant values, and variable values during execution of portions of applications and/or other processing logic. For example, in one embodiment, parts of control logic to perform one or more operations on dynamic processing memory computing device 100 may reside within volatile memory during execution of the respective portions of the operation by dynamic processing memory computing device 100. The term "processing logic" or "logic," as used herein, refer to control flow instructions, instructions for performing computations, and instructions for associated access to resources. During execution, respective applications 170, operation system functions 150, processing logic instructions and system software may reside in volatile memory. Control logic instructions fundamental to operating system 150 may generally reside in volatile memory during execution.

Operating system 150 includes components and software/firmware providing functionality to manage the hardware components of dynamic processing memory computing device 100 and to provide common services. In various embodiments, processes defined by operating system 150 may execute on dynamic processing memory computing device 100 and provide common services. These common services include, for example, scheduling applications for execution within dynamic processing memory computing device 100, fault, management, interrupt service, as well as processing the input and output of other applications. Operating system 150 and middleware 190 may run in either non-volatile memory 140, volatile memory 130, or some combination of both.

Processing logic for applications 170, operating system 150, and system software can include instructions specified in a programming language such as C and/or in a hardware description language such as Veriolog, RTL, or netlists, to enable configuring a manufacturing process through the generation of maskworks/photomasks to generate a hardware device embodying aspects of the present invention described herein.

A person skilled in the relevant art will understand, upon reading this description that dynamic processing memory computing device 100 can include one or more input interfaces, non-volatile storage, one or more output interfaces, network interfaces, and one or more displays or display interfaces.

Settings 180 may include but is not limited to dynamic processing memory computing device 100's network configuration, energy-saving preferences, X.509 security certificates, and/or data specific to applications 170 that exist outside a mode, such as the book marks associated with the web browser of dynamic processing memory computing device 100. Settings 180 may also describe access to settings rather than settings themselves.

Dynamic processing memory computing device 100 incorporates dynamic processing memory core 105 onto a single memory chip to enable computational processing and memory storage from the single memory chip. Dynamic processing memory core 105 may incorporate both dynamic memory block 135 and dynamic processor 125 onto the same single memory chip such that dynamic processor 125 may access memory such that dynamic processor 125 may access and/or transfer data to and from dynamic memory block 135 without having to transfer data off the single memory chip to access memory. The single memory chip is an integrated circuit that is positioned on a single piece of semiconductor material such that dynamic memory block 135 and dynamic processor 125 are positioned on the single piece of semiconductor material as the integrated circuit. Memory that is positioned off-chip from dynamic processor 125 is positioned on a different piece of semiconductor material and incorporated into a different integrated circuit than dynamic processor 125. Thus, dynamic processor 125 and dynamic memory block 135 may be positioned on the single memory chip as opposed to dynamic processor 125 accessing and/or transferring data to memory positioned off the single memory chip.

Dynamic processing memory core 105 may include dynamic memory block 135 and dynamic memory block 135 may include at least one memory storage device, such as one or more memory cells 160, and included in dynamic processing memory core 105 and positioned on the single memory chip. Dynamic memory block 135 may store a plurality of data elements with each data element stored at a memory location associated with memory cells 160. Dynamic memory block 135 may be dynamic in that any memory location associated with any memory cell 160 may be accessed by dynamic processor 125 and may transfer any data element stored in the corresponding memory location to dynamic processor 125 and/or store any data element provided by dynamic processor 125 as instructed by configurable processor controller 110. The data elements may include any type of data, settings, applications, instructions, rules, and/or any other type of computer based aspect that may be accessed by the operating system of a computing device that will be apparent from those skilled in the relevant art(s) without departing from the spirit and scope of the present disclosure.

Dynamic processing memory core 105 may also include dynamic processor 125 and dynamic processor 125 may include at least one processing device, such as one or more processor cores 120, and included in dynamic processing memory core 105 and positioned on the single memory chip. Dynamic processor 125 may execute a plurality of memory instructions with each memory instruction associated with corresponding data elements that are stored in corresponding memory locations associated with memory cells 160. Dynamic processor 125 may be dynamic in that any processor 120 may execute any memory instruction and in doing so access any memory location of any memory cell 160 and may transfer any data element stored in the corresponding memory location of the corresponding memory cell 160 to execute any memory instruction and/or transfer any data element in the corresponding memory location of the corresponding memory cell 160 in executing any memory instruction as instructed by configurable processor controller 110. The memory instruction is the instruction that each processor core 120 is to execute that requires each processor core 120 to access and/or transfer data to the corresponding memory location of the corresponding memory cell 160 as instructed by configurable processor controller 110.

Configurable processor controller 110 may transition dynamic processing memory core 105 from a memory storage device to a processing device by instructing at least one processing device, such as one or more processing cores 120, to execute at least one memory instruction that one or more processing cores 120 is to execute based on the memory location of the data elements that are associated with the at least one memory storage device, such as one or more memory cells 160. As noted above, dynamic processor 125 that includes one or more processor cores 120 that is positioned on a single chip as dynamic memory block 135 that includes one or more memory cells 160 to formulate dynamic processing memory core 105. In doing so, configurable processor controller 110 may transition dynamic processing memory core 105 into a processing device by instructing dynamic processor 125 to execute memory instructions thereby initializing the processing capabilities of dynamic processing memory core 105.

Configurable processor controller 110 may transition dynamic processing memory core 105 from the processing device to the memory storage device by instructing the at least one processing device, such as one or more processor cores 120, to not execute the memory instructions thereby terminating the computational processing of dynamic processing memory core 105 and maintaining the memory storage provided by the at least one memory storage device, such as one or more memory cells 160. As noted above, dynamic processor 125 and dynamic memory block 135 are positioned on a single chip to formulate dynamic processing memory core 105. In doing so, configurable processor controller 110 may transition dynamic processing memory core 105 into a memory storage device by instructing dynamic processor 125 to terminate the execution of memory instructions thereby transitioning dynamic processing memory core 105 from having processing capabilities to simply acting as a memory storage device with the memory cells 160 storing data elements.

Dynamic processing memory core 105 may serve dual roles in that dynamic processing memory core 105 may operate as a processing device in that dynamic processing memory core 105 executes memory instructions and/or a memory storage device in that dynamic processing memory core 105 stores memory instructions. Dynamic processing memory core 105 may operate as a processing device in executing memory instructions simultaneously as dynamic memory core 105 operates as a memory storage device in storing data elements in response to the execution of those memory instructions. Dynamic processing memory core 105 may also operate as simply a memory storage device in that dynamic processing memory core 105 may terminate the execution of memory instructions thereby no longer operating as a processing device and simply operating as a memory storage device.

Configurable processor controller 110 may instruct dynamic processing memory core 105 as to when to operate as a processing device as well as the memory instructions that are to be executed by each respective processor core 120 as well as the memory cells 160 that are to be accessed by each respective processor core 120 when executing the memory instructions. Configurable processor controller 110 may also instruct dynamic processing memory core 105 as to when to operate as a memory storage device as well as the memory cells 160 that are to store data elements.

The positioning of dynamic processor 125 and dynamic memory block 135 on a single chip may enable each of the processor cores 120 to access each of the memory cells 160 as instructed by configurable processor controller 110 when executing memory instructions without having to transfer data elements off the single chip when executing the memory instructions. Rather than each of the processor cores 120 having to transfer data elements to and/or access data elements from conventional memory positioned off-chip, each of the processor cores 120 may transfer data elements and/or access data elements from each of the memory cells 160 simply positioned on the same chip as included in dynamic processing core 105. In doing so, dynamic processing memory core 105 may have significant processing capabilities in that each of the processor cores 120 may transfer data elements to each of the memory cells 160 positioned on the same chip as included in dynamic processing memory core 105. In doing so, the delay in executing memory instructions when having to transfer data elements to conventional memory positioned off-chip is eliminated thereby enabling to execute a significant increase in memory instructions as well as an increase in complexity of memory instructions.

For example, the positioning of dynamic processor 125 and dynamic memory block 135 on a single chip as included in dynamic processing memory core 105 may enable dynamic processing memory computing device 100 to offload computations from the central processing unit (CPU) and the GPU to dynamic processing memory core 105. The processing capabilities of dynamic processor 125 and the memory storage capabilities of dynamic memory block 135 positioned on a single chip as included in dynamic processing memory core 105 may enable dynamic processing memory core 105 to have the computation bandwidth and speed to execute such an increase of memory instructions as well as complex memory instructions to handle the computations of the CPU and GPU. In such an example, dynamic processing memory core 105 may execute memory instructions that are typically executed by the CPU as well as execute memory instructions typically executed by the GPU as instructed by configurable processor controller 110 thereby enabling dynamic processing memory core 105 to serve as an extension of the CPU and/or GPU due to the positioning of dynamic processor 125 and dynamic memory block 135 on a single memory chip included in dynamic processing memory core 105.

In doing so, dynamic processing memory core 105 may significantly increase the overall computation capabilities of dynamic processing memory computing device 100. For example, dynamic processing memory core 105 may provide a significant increase in computation power to dynamic processing memory computing device 100 such that dynamic processing memory computing device 100 may execute applications 170 associated with graphics, deep learning via a neural network, machine learning via a neural network, artificial intelligence, data processing, IoT applications, sensor fusion, self-driving cars, and/or any other type of application that requires significant computation capabilities that dynamic processing memory core 105 may be able to execute due to dynamic processor 125 and dynamic memory block 135 positioned on a single memory chip included as dynamic processing memory core 105 that will be apparent to those skilled in the relevant art(s) without departing from the spirit and scope of the disclosure.

Dynamic Processing Memory Core

As noted above, dynamic processing memory computing device 100 may operate as both a processing device and a memory storage device. FIG. 2 is a block diagram of an exemplary dynamic processing memory core 200 that provides further detail with regard to how dynamic processing memory core 200 operates as both a processing device and a memory storage device. Dynamic processing memory core 200 includes dynamic memory block 135, a dynamic buffer 210, a configurable processor controller 230, and a dynamic processor 125. Dynamic memory block 135 includes one or more memory cells 160. Configurable processor controller includes a lookup table 250. Lookup table 250 includes lookup table bits 220. Dynamic processing memory core 200 shares many similar features with dynamic processing memory core 105; therefore, only the differences between dynamic processing memory core 200 and dynamic processing memory core 105 are to be discussed in further detail.

As noted above, dynamic memory block 135 may include one or more memory cells 160 in that configurable processor controller 230 may instruct dynamic memory block 135 as to the corresponding memory location in each corresponding memory cell 160 that may store data elements as dynamic processor 225 executes memory instructions. Further, dynamic memory block 135 may simply operate as a memory storage device and store data elements when configurable processor controller 230 instructs dynamic processor to no longer execute memory instructions. As noted above, dynamic memory block 135 may include volatile memory such that each memory cell 160 may incorporate volatile memory such as DRAM and/or SRAM and/or any combination thereof. The quantity of memory cells 160 included in dynamic memory block 135 may be any quantity and/or combination of volatile memory, such as DRAM and/or SRAM, that may be incorporated onto the single memory chip that dynamic memory processing core 200 is positioned on will be apparent to those skilled in the relevant art(s) without departing from the spirit and scope of the disclosure.

Configurable processor controller 230 may determine the memory location in each corresponding memory cell 160 that each data element is to be stored as dynamic processor 225 executes memory instructions. For example, a first data element associated with generating a graphic of a sphere may be stored in a first memory location of a first memory cell 160 as instructed by configurable processor controller 230. As dynamic processor 225 executes memory instructions to generate a graphic of the sphere, configurable processor controller 230 may allow dynamic processor 225 to access the first memory location of the first memory cell 160 to access the first data element stored there in generating the graphic of the sphere. Configurable processor controller 230 may then instruct a second memory location of a second memory cell 160 to store the first data element following the generation of the graphic of the sphere. In doing so, dynamic memory block 135 may be enabled to act as dynamic memory where the memory location of data elements that are stored and/or accessed may be adjusted in a dynamic manner as instructed by configurable processor controller 230.

Dynamic buffer 210 may assist in the dynamic access and/or storage of data elements in memory cells 160 of dynamic memory block 135 in that dynamic buffer 210 may be a region of physical memory storage that may temporality store data elements that are being transitioned between different memory locations of different memory cells 160 and dynamic processor 225 as dynamic processor 225 executes memory instructions. The dynamic transitioning of data elements between different memory locations of different memory cells 160 and dynamic processor 225 as instructed by configurable processor controller 230 requires dynamic buffer 210 to temporarily store data elements that have been requested by configurable processor controller 230 to be transitioned to and/or from dynamic processor 225 as dynamic processor 225 executes memory instructions.

Rather than simply operating as a conventional First In First Out (FIFO) buffer, dynamic buffer 210 may operate dynamically in that the data elements that are temporarily stored by dynamic buffer 210 are selected based on dynamic buffer 210 executing operations rather than simply releasing each data element to dynamic processor 225 on a FIFO basis. In doing so, memory cells 160 may be associated with dynamic buffer 210 and dynamic buffer 210 may select the respective data elements that are to be temporarily stored in dynamic buffer 210 and transitioned from each respective memory cell 160 to dynamic buffer 210 by executing operations. Vector cores 220 may also be associated with dynamic buffer 210 and dynamic buffer 210 may select the respective elements that are to be transitioned from dynamic buffer 210 to each respective vector core 220 for execution of memory instructions by executing operations.

For example, dynamic buffer 210 may execute arithmetic operations and/or logic operations to determine the data elements that are to be released to the dynamic processor 225 as well as the data elements that are to be temporarily stored in dynamic buffer 210 from dynamic memory block 135 before transitioning to dynamic processor 225. In such an example, dynamic buffer 210 may operate as an arithmetic logic unit (ALU) to select the data elements that are to be temporarily stored in dynamic buffer 210 from respective memory cells 160 as well as select the data elements that are to be transitioned to respective vector cores 220 in executing memory instructions based on the ALU operations executed by dynamic buffer 210. In such an example, dynamic buffer 210 in operation as an ALU may execute AND operations, OR operations, XOR operations, ADD operations, SUBTRACT operations, COMPARE operations, and/or any other operation that enables dynamic buffer 210 to adequately select the data operations to temporarily store from dynamic memory block 135 and/or transition to dynamic processor 225 that will be apparent to those skilled in the relevant art(s) without departing from the spirit and scope of the disclosure.

Configurable processor controller 230 may be positioned in between dynamic memory block 135 and dynamic processor 225 such that the data elements that are transitioned between dynamic memory block 135 and dynamic processor 225 flow through configurable processor controller 230. As noted above, configurable processor controller 230 may transition dynamic processing memory core 200 between operating as a processing device and/or operating as a memory storage device and/or operating as a processing device and memory storage device simultaneously. In doing so, configurable processor controller 230 may instruct each memory cell 160 as to the data elements that are to be stored in each respective memory cell 160 and/or transitioned from each respective memory cell 160 to a corresponding vector core 220 for execution of memory instructions. Configurable processor controller 230 may also instruct each vector core 220 as to the data elements that each vector core 220 is to access from each respective memory cell 160 as well as the memory location in each respective memory cell 160 as to each data element that is to be stored when executing the memory instructions. In doing so, configurable processor controller 230 may determine how dynamic processing memory core 200 is to execute memory instructions with regard to the execution of memory instructions via vector cores 220 and the storage and/or access of data elements via memory cells 160.

Configurable processor controller 230 may be a reconfigurable element that is positioned such that data elements flow through configurable processor controller 230 as data elements are transitioned between dynamic memory block 135 and dynamic processor 225. In doing so, configurable processor controller 230 may be dynamic in that configurable processor controller 230 may be reconfigured as to how to instruct and determine the transfer of data elements between dynamic memory module 160 and dynamic processor 225 in the execution of memory instructions. Configurable processor controller 230 may include FPGAs, ASICs, DSPs, and/or any other reconfigurable device that may enable configurable processor controller 230 to impact the transition of data elements between dynamic memory module 160 and dynamic processor 225 that will be apparent to those skilled in the relevant art(s) without departing from the spirit and scope of the disclosure.

Configurable processor controller 230 may determine whether each data element is to be compressed when stored in each corresponding memory location associated with each memory cell 160 and whether each data element is to be decompressed when executed by dynamic processor 225. With dynamic memory block 135 and dynamic processor 225 positioned on a single memory chip and included in dynamic processing memory core 200 such that data elements do not have to be transitioned off-chip, configurable processor controller 230 is also included in dynamic processing memory core 200 such that the compression and/or decompression of the data elements is also done on the single memory chip. As data elements are transitioned between dynamic memory core 135 and dynamic processor 225, configurable processor controller 230 may compress and/or decompress the data elements such that the amount of memory space occupied in dynamic memory core 135 is reduced while still maintaining sufficient data elements in a compressed state for dynamic processor 225 to adequately execute the memory instructions. An increased amount of data elements may be stored in dynamic memory core 135 when configurable processor controller 230 compresses the data elements to be stored in dynamic memory block 135. The data elements may then be decompressed such that dynamic processor 225 may sufficiently incorporate the data elements to execute the memory instructions.

Configurable processor controller 230 may dynamically determine the data elements to compress and/or decompress as configured. For example, configurable processor controller 230 may determine the data elements to compress and/or decompress based on applications 170 executed by dynamic processing memory core 200. In such an example, configurable processor controller 230 may dynamically compress all data elements that are stored in dynamic memory module 135 and then decompress all data elements that are to be transitioned to dynamic processor 225 when dynamic processing memory core 200 is executing a first application 170. Configurable processor controller 230 may selectively compress a first portion of data elements while refraining from compressing a second portion of data elements that are stored in dynamic memory module 135 and then decompressing the first portion of data elements that are to be transitioned to dynamic processor 225 when dynamic processing memory core 200 is executing a second application 170. Configurable processor controller 230 may then dynamically refrain from compressing any data elements that are stored in dynamic memory module 135 when dynamic processing memory core 200 is executing a third application 170.

Configurable processor controller 230 in being positioned such that data elements flow through configurable processor 230 controller when transitioning between dynamic memory block 135 and dynamic processor 225 enables configurable processor controller 230 to reduce the memory space of dynamic memory module 135 that is occupied by the data elements before and/or after the data elements are incorporated into vector cores 220. For example, dynamic processing memory core 200 is to execute memory instructions regarding a 32-bit pixel. Rather than storing a 32-bit pixel in dynamic memory block 135 after the 32-bit pixel is generated by dynamic processor 225, configurable processor controller 230 may decompress the 32-bit pixel down to an 8-bit pixel and thereby the 8-bit pixel is stored in dynamic memory block 135 instead of the 32-bit pixel. Thus, significant memory space of dynamic memory block 135 is conserved in the compression of the 32-bit pixel to the 8-bit pixel. Configurable processor controller 230 may then decompress the 8-bit pixel to a 32-bit pixel when dynamic processor 225 requires the 32-bit pixel to execute memory instructions.

The compression and/or decompression of configurable processor controller 230 may also provide additional security features to dynamic processing memory core 135. In order for a hacker to fraudulently access the data elements stored in dynamic memory module 135, the hacker would have to determine the compression scheme in how configurable processor controller 230 compressed the data elements in order for the hacker to then adequately decompress the data elements to gain access to the data included in the data elements.

For example, dynamic processing memory core 200 may be incorporated into a database application 170 where dynamic processing memory core 200 is searching through hundreds of thousands of records. Configurable processor controller 230 may then compress the data elements associated with the hundreds of thousands of records and store in dynamic memory block 135. Configurable processor controller 230 may then decompress the data elements in real-time when dynamic processing memory core 200 is to execute applications 170 regarding searching through the hundreds of thousands of records. After the data elements are decompressed and analyzed and no longer needed by dynamic processor 225, configurable processor controller 230 may then compress the data elements again in real-time but incorporate a different compression scheme in the compressing. Configurable processor controller 230 may then adjust the compression scheme of the compressed data elements after a period of time expires over and over again. For example, configurable processor controller 230 may adjust the compression scheme every 5 seconds thereby requiring any hacker to somehow determine the compression scheme of the data elements that automatically changes every 5 seconds in order to access the data elements. In doing so, personal addresses, social security numbers, and so on may be stored securely in dynamic memory block 135 and safe from any potential hackers.

Configurable processor controller 230 may execute operations such as but not limited to COMPARE, Boolean Operations such as AND, OR, XOR, NOT and so on, 2's Complement, shifter/rotate (L/R), adder, subtractor, interpolator (linear/bilinear), counter, incrementer, decrementer, CODEC, compress, duplicate, Bitfield extension, SHA-256 and other cryptographic hardware and/or any other operation that will be apparent to those skilled in the relevant art(s) without departing from the spirit and scope of the disclosure.

Dynamic Memory Block Performing Computation Operations

As noted above, FIG. 2 depicts dynamic processing memory core 200 that includes dynamic memory block 135 that may operate as a memory storage device as well as execute computation operations. FIG. 3 is a block diagram of an exemplary dynamic processing memory core 300 that provides further detail with regard to how dynamic memory block 135 operates as a memory storage device as well as execute computer operations. Dynamic processing memory core 300 includes dynamic memory block 135, configurable processor controller 230, an address multiplexor 350, and a plurality of sense amplifiers 380($a$-$n$) where n is an integer that is equal to half of a plurality of bit lines 340($a$-$n$). Address multiplexor 350 includes control lines 360($a$-$n$), where n is an integer equal to the quantity of control lines applied to dynamic memory block 135. Configurable processor controller 230 includes input lines 240. Dynamic memory block 135 includes a plurality of memory cells 310($a$-$n$), where n is an integer equal to or greater than one, a plurality of memory cell registers 320($a$-$n$), where n is an integer equal to or greater than one, a plurality of bit lines 340($a$-$n$), where n is an integer equal to the quantity of bits applied to dynamic memory block 135, a plurality of word lines 330($a$-$n$), where n is an integer equal to the quantity of words applied to dynamic memory block. Each memory cell 310($a$-$n$) stores a corresponding data element 370($a$-$n$), where n is equal to the quantity of memory cells 310($a$-$n$).

As noted above, dynamic memory block 135 may include one or more memory cells 310($a$-$n$) in that configurable processor controller 230 may transition dynamic memory block 135 to execute computation operations. Further, dynamic memory block 135 may simply operate as a memory storage device and store data elements 370($a$-$n$) when configurable processor controller 230 no longer requests that dynamic memory block 135 to execute computation operations. As noted above, dynamic memory block 135 may include volatile memory such that each memory cell 310($a$-$n$) may incorporate volatile memory such as DRAM and/or SRAM and/or any combination thereof. The quantity of memory cells 310($a$-$n$) included in dynamic memory block 135 may be any quantity and/or combination of volatile memory, such as DRAM and/or SRAM that will be apparent to those skilled in the relevant art(s) without departing from the spirit and scope of the disclosure.

Configurable processor controller 230 may be meshed with dynamic memory block 135 such that dynamic memory block 135 may move from simply operating as a storage device but may execute computation operations as well based on configurable processor controller 230. Dynamic memory block 135 includes memory cells 310($a$-$n$) that simply includes standard DRAM and/or SRAM and stores each corresponding data element 370(a-n) in a manner that is standard for DRAM and/or SRAM. However, as noted above, configurable processor controller 230 may be a reconfigurable element that may be dynamic in that configurable processor controller 230 may be reconfigured to act as both logic in applying different functions to memory cells 310(a-n) but also may act as memory as well in that configurable processor controller 230 may store data elements. Configurable processor controller 230 may include FPGAs, ASICs, DSPs, and/or any other reconfigurable device that may enable configurable processor controller 230 to store data elements as well as be reconfigured such that the stored data elements may act as logic in applying functions that will be apparent to those skilled in the relevant art(s) without departing from the spirit and scope of the disclosure.

In doing so, configurable processor controller 230 may be configured to store data elements as a memory device such that the stored data elements that when applied to data elements 370(a-n) stored in corresponding memory cells 310(a-n) such an application of data elements may execute a function. Configurable processor controller 230 may then be reconfigured to store different data elements as a memory device that when applied to data elements 370(a-n) stored in corresponding memory cells 310(a-n) the application of different data elements stored in configurable processor controller 230 may execute a different function. In doing so, configurable processor controller 230 when meshed with the standard DRAM and/or SRAM of memory cells 310(a-n) may transition memory cells 310(a-n) from operating as a standard memory storage device to executing computation operations.

Dynamic memory block 135 includes bit lines 340(a-n). Each bit line 340(a-n) may be positioned vertically across dynamic memory block 135. A bit signal may then be applied to each bit line 340(a-n). Dynamic memory block 135 also includes word lines 330(a-n). Each word line may be positioned horizontally across dynamic memory block 135. A control signal 360(a-n) may then be applied to each word line 330(a-n). The intersection of bit line 340(a-n) and each word line 330(a-n) formulates a corresponding memory cell 310(a-n). As shown in FIG. 3, memory cells 310(a-n) may be formulated from the intersection of bit lines 340(a-n) and word lines 360a and 360b thereby formulating memory cells 310(a-n). Each memory cell 310(a-n) may then store a corresponding data element 370(a-n). As shown in FIG. 3, memory cell 310a stores data element 370a of "1". Memory cell 310b stores data element 370b of "0". Memory cell 310c stores data element 370c of "1". Memory cell 310d stores data element 370d of "1". Memory cell 310e stores data element 370e of "1".

Each word included in dynamic memory block 135 may define the size of a corresponding memory cell register 320(a-n). Each memory cell register 320(a-n) may include a corresponding group of memory cells 310(a-n) as defined by the word associated with each corresponding memory cell register 320(a-n). As shown in FIG. 3, memory cell register 320b includes memory cells 310(a-n) as defined by the corresponding word for memory cell register 320b. In such an example, the word for corresponding memory cell register 320b may define the size of memory cell register 320b as including a total of six memory cells in memory cells 310(a-n). However, the size of any memory cell register 320(a-n) as defined by the corresponding word may be include any quantity of memory cells 310(a-n) that will be apparent to those skilled in the relevant art(s) without departing from the spirit and scope of the disclosure.

Address multiplexor 350 may incorporate an address in that a plurality of address lines may input into address multiplexor and then define a corresponding address in a specified bit length. Address multiplexor 350 may then output the corresponding address via control lines 360(a-n) such that each control line 360(a-n) drives each corresponding memory cell 310(a-n). Each control line 360(a-n) when activated based on each address that is to be applied to dynamic memory block 135 may include a voltage signal. In doing so, each voltage signal applied by each corresponding control line 360(a-n) may then activate the corresponding memory cells 310(a-n) such that the data elements stored in the corresponding memory cells 310(a-n) may be accessed. For example, control signal 360a and control signal 360b may activate memory cells 310(a-n) thereby enabling data elements 370(a-n) that are stored in corresponding memory cells 310(a-n) to be accessed.

Sense amplifiers 380(a-n) may be positioned such that each of bit lines 340(a-n) terminate into a corresponding sense amplifier 380(a-n). For example, a set of two bit lines 340(a-n) may terminate into a corresponding sense amplifier 380(a-n). In such an example, bit lines 340f and 340n may terminate into sense amplifier 380a. Bit lines 340d and 340e may terminate into sense amplifier 380b and so on. Sense amplifiers 380(a-n) may be positioned such that each of bit lines 340(a-n) terminate into a corresponding sense amplifier 380(a-n) in a manner that each sense amplifier 380(a-n) is positioned opposite where each bit signal is applied to each corresponding bit line 340(a-n).

In doing so, each sense amplifier 380(a-n) may be part of the read circuitry of dynamic memory block 135 in that when each data element 370(a-n) is read from each corresponding memory cell 310(a-n) after the appropriate bit signals and control signals 360(a-n) have been applied to dynamic memory block 135 each sense amplifier 380(a-n) may sense the low power signals associated with each bit line 340(a-n). The low power signals associated with each bit line 340(a-n) represent each corresponding data element 370(a-n) that is currently stored in each corresponding memory cell 310(a-n). For example, each data element 370(a-n) stored in each corresponding memory cell 310(a-n) may be the logic of "0" or "1". Each sense amplifier 380(a-n) may then amplify the lower power signals associated with each bit line 340(a-n) such that the logic included in each data element 370(a-n) may be adequately read as a logic signal thereby elevating each power signal provided by each bit line 340(a-n) such that each corresponding data element 370(a-n) may be identified at the logic level of "0" or "1".

As noted above, dynamic memory block 135 may include SRAM, DRAM, and/or combination thereof. With regard to SRAM, each data element 370(a-n) associated with each corresponding memory cell 310(a-n) may be read when each word line 330(a-n) is turned on thereby activating each memory cell 310(a-n) included in the corresponding row of each word line 330(a-n). The stored data element 370(a-n) in each activated memory cell 310(a-n) may then be provided by each corresponding bit line 340(a-n) and each sense amplifier 380(a-n) may amplify each signal provided by each bit line 340(a-n) to a corresponding logic level of "0" or "1" based on the stored data element 370(a-n) stored in each activated memory cell 310(a-n). The SRAM is static memory in that each data element 370(a-n) continues to be stored in each corresponding memory cell 310(a-n) until each data element 370(a-n) is adjusted thereby permanently storing each data element 370(a-n) until each corresponding data element 370(a-n) is written with a new data element 370(a-n). In doing so, a memory refresh is not required for SRAM as is required for DRAM as will be discussed below. However, significantly more DRAM cells may be included in dynamic memory block 135 as compared to SRAM cells.

With regard to DRAM, DRAM behaves similarly to SRAM as discussed in detail above but requires an additional function in a memory refresh. Each data element 370(a-n) is stored as an electric charge in each corresponding memory cell 310(a-n) with regard to DRAM. Each read operation to read each data element 370(a-n) stored in each corresponding cell depletes the charge in the cell thereby destroying each data element 370(a-n). Each sense amplifier 380(a-n) may then immediately write back each data element 370(a-n) into each corresponding memory cell 310(a-n) by applying a voltage to each memory cell 310(a-n) thereby recharging the capacitor and is executed as a memory refresh. Although significantly more DRAM cells may be included in dynamic memory block 135 than DRAM cells, computation operations associated with DRAM cells take longer to execute than with SRAM cells due to the memory refresh of DRAM cells.

Configurable processor controller 230 may transition memory cells 310(a-n) from acting as a storage device to a computation device by adjusting the storage of data elements 370(a-n) as stored by corresponding memory cells 310(a-n) to execute the computation operation. Configurable processor controller 230 may also transition memory cells 310(a-n) from the computing device to the storage device by maintaining the storage of data elements by memory cells 310(a-n) in a static state thereby preventing storage of data elements 370(a-n) by memory cells 310(a-n) from being adjusted. In doing so, memory cells 310(a-n) may operate as a standard memory storage device and store data elements 370(a-n) in each corresponding memory cell 310(a-n) as well as execute a computation operation when the storage of data elements 370(a-n) is adjusted thereby triggering the computation operation and enabling memory cells 310(a-n) to function as a memory storage device and a computation device.

In adjusting the storage of data elements 370(a-n) by corresponding memory cells 310(a-n), configurable processor controller 230 may include a lookup table 250 that stores corresponding lookup table bits 220 as shown in FIG. 2. Configurable processor controller 230 may apply each combination of lookup table bits 220 as stored in configurable processor controller 230 to each corresponding memory cell 310(a-n). In doing so, configurable processor controller 230 may adjust each data element 370(a-n) as stored by corresponding memory cell 310(a-n) to adjust each data element 370(a-n) as stored by corresponding memory cell 310(a-n) to execute a computation operation. Thus, configurable processor controller 230, such as a FPGA, may be meshed with dynamic memory block 135 such that dynamic memory block 135 that includes standard memory cells 310(a-n) may be transitioned from operating as a standard storage device to executing computation operations.

Configurable processor controller 230 not only operates as a function in that each lookup table bit 220 is applied to each corresponding memory cell 310(a-n) to execute a computation operation, but may also operate as memory in that configurable processor controller 230 may store data elements with each data element stored in a corresponding function memory cell included in configurable processor controller 230. Configurable processor controller 230 may store each data element as provided in each lookup table bit 220 in a corresponding function memory cell that is stored by configurable processor controller 230. Each lookup table bit 220 that is included in the lookup table 250 of configurable processor controller 230 may be configured such that each combination of lookup table bits 220 may operate as a function when such a combination of lookup table bits 220 is applied to the corresponding data elements 370(a-n) stored by the corresponding memory cells 310(a-n). In doing so, configurable processor controller 230 may be configured such that each combination of lookup table bits 220 operate as a function as included in the lookup table 250 may be stored by configurable processor controller 230 as data elements in corresponding function memory cells included in configurable processor controller 230. Thus, configurable processor controller 230 may operate as both a function as well as a storage device.

Configurable processor controller 230 may apply each data element stored in each corresponding function memory cell included in configurable processor controller 230 to each data element 370(a-n) stored in each corresponding memory cell 310(a-n) included in dynamic memory block 135 via input lines 240. Configurable processor controller 230 may adjust each data element 370(a-n) stored in each corresponding memory cell 310(a-n) included in dynamic memory block 135 with the corresponding data element from each corresponding function memory cell included in configurable processor controller 230.

For example, configurable processor controller 230 may include four lookup table bits 220 in that the lookup table 250 included in configurable processor controller 230 may store different variations of functions in the lookup table 250 based on the four lookup table bits 220. Each combination of lookup table bits 220 may be stored as data elements in corresponding functional memory cells included in configurable processor controller 230. In doing so, each combination of the four lookup table bits 220 as stored as data elements in corresponding function al memory cells included in configurable processor controller 230 may transpose to a different function that may be executed when applied to data elements 370(a-n) stored in corresponding memory cells 310(a-n) of dynamic memory block 135. Each combination of the four lookup table bits 220 transposing to a different function may be applied to a corresponding block of memory cells 310(a-n) via input lines 240.

Each combination of four lookup table bits 220 transposing to a different function may be applied to corresponding block of memory cells 310(a-n) based on the corresponding control line 360(a-n) that drives the corresponding block of memory cells 310(a-n). In such an example, each corresponding control line 360(a-n) may be associated with a corresponding address provided by address multiplexor 350. Each corresponding address may identify the function that is to be executed by a corresponding block of memory cells 310(a-n). Each corresponding control line 360(a-n) may then drive the corresponding block of memory cells 310(a-n) based on the function identified by the corresponding address. In doing so, configurable processor controller 230 may then apply the appropriate combination of four lookup table bits 220 to the appropriate block of memory cells 310(a-n) to execute the appropriate function as identified by the corresponding address.

In such an example, configurable processor controller 230 may apply a first combination of four lookup table bits 220 to memory cell register 320b that includes memory cells 310(a-n) based on the control line 360a that drives memory cells 310(a-n) based on the corresponding address line. In doing so, configurable processor controller 230 may select the first combination of four lookup table bits 220 to apply to data elements 370(a-n) stored in memory cells 310(a-n) such that memory cells 310(a-n) execute the computation operation as required by the address line that corresponds to control line 360a that drives memory cells 310(a-n). In applying the first combination of four lookup table bits 220 to data elements 370(a-n) stored in memory cells 310(a-n), data elements 370(a-n) may be adjusted accordingly and in doing so may trigger memory cells 310(a-n) to execute the computation operation as required by the address line that corresponds to control line 360a. Each adjusted data element 370(a-n) may then be stored in memory cell register 320b after each of the four lookup table bits 220 included in the first combination is applied.

Any combination of lookup table bits 220 may be selected and then applied to any block of memory cells 310(a-n) based on the function required by the address line to be executed by the block of memory cells 310(a-n) based on the data elements 370(a-n) stored in the block of memory cells 310(a-n). In doing so, the function may be adjusted based on the combination of lookup table bits 220 stored in the corresponding function memory cells included in configurable processor controller 230 thereby allowing flexibility in the functions that may be executed by each respective block of memory cells 310(a-n). Thus, the combination of the lookup table bits 220 stored in each corresponding function memory cell included in configurable processor controller 230 as well as the ability to reconfigure the combination of lookup table bits 220 and then the application of each combination of lookup table bits 220 to each specified block of memory cells 310(a-n) provides flexibility in the different computation operations that may be executed by dynamic memory block 135.

The quantity of lookup table bits 220 and the combinations of lookup table bits 220 may include any quantity of lookup table bits 220 that may be stored and applied by configurable processor controller 220 that will be apparent to those skilled in the relevant art(s) without departing from the spirit and scope of the disclosure. The quantity of memory cells 310(a-n) included in each block of memory cells 310(a-n) that each combination of lookup table bits 220 is applied may include any quantity of memory cells 310 (a-n) that may have the corresponding data elements 370 (a-n) adjusted by the combination of lookup table bits to execute the computation operation as required by the corresponding address line that will be apparent to those skilled in the relevant art(s) without departing from the spirit and scope of the disclosure.

Configurable processor controller 230 may store each data element in the corresponding function memory cell included in configurable processor controller 230 so that when each data element is applied to each data element 370(a-n) stored in each corresponding memory cell 310(a-n) included in dynamic memory block 135 executes a Boolean function. Configurable processor controller 230 may apply the Boolean function to memory cells 310(a-n) included in dynamic processor memory block 135 by applying each data element stored in each corresponding function memory cell included in configurable processor controller 230 to each data element stored in each corresponding memory cell 310(a-n) included in dynamic memory block 135 to execute the Boolean function.

For example, configurable processor controller 230 may store a combination of lookup bits 220 such that when the combination of lookup bits 220 is applied to data elements 370(a-n) as stored in memory cells 310(a-n) an AND function is executed. Configurable processor controller 230 may select the combination of lookup bits 220 to apply to data elements 370(a-n) as stored in memory cells 310(a-n) based on word 330a. Corresponding control line 360a may drive memory cells 310(a-n) as identified by word 330a to execute an AND function. In doing so, configurable processor controller 230 may select the combination of lookup bits 220 as stored in the corresponding function memory cells of configurable processor controller 230 to apply to data elements 370(a-n) as stored in memory cells 310(a-n) to execute the AND function as required by control line 360a. In applying the combination of lookup bits 220 to data elements 370(a-n) as stored in memory cells 310(a-n) to execute the AND function, data elements 370(a-n) may then be adjusted based on the AND function and thereby stored in memory cell register 320b.

Configurable processor controller 230 may store each data element in the corresponding function memory cell included in configurable processor controller 230 so that when each data element is applied to each data element stored in each corresponding memory cell 310(a-n) included in dynamic memory block 135 the data elements included in configurable processor controller 230 operate as a binary adder to execute an addition operation. Configurable processor controller 230 may apply the binary adder to each corresponding memory cell 310(a-n) included in dynamic memory block 135 by applying each data element stored in each corresponding function memory cell included in configurable processor controller 230 as the binary adder to execute the addition operation.

For example, configurable processor controller 230 may store each combination of lookup table bits 220 such that each combination of lookup table bits 220 when combined represent a binary adder. A binary may be a basic computation structure that when implemented with data elements 370(a-n) stored in corresponding memory cells 310(a-n) result in the execution of significant computation operations. In doing so, configurable processor controller 230 may apply each combination of lookup table bits 220 that result in a binary adder and then apply to data elements 370(a-n) stored in memory cells 310(a-n) thereby adjusting data elements 370(a-n) resulting in the addition operation being executed by memory cells 310(a-n) and storing the adjusted data elements 370(a-n) following the execution of the addition operation in memory cell register 320b.

Configurable processor controller 230 may apply each data element in the corresponding function memory cell included in configurable processor controller 230 so that when each data element is applied to each data element 370(a-n) stored in each corresponding memory cell 310(a-n) included in dynamic memory block 135 is shifted thereby executing a multiplication operation. Configurable processor controller 230 may store a combination of lookup table bits 220 such that when the combination of lookup bits 220 is applied to data elements 370(a-n) as stored in memory cells 310(a-n) that each data element 370(a-n) is shifted to the right and/or shifted to the left. In doing so, the combination of lookup bits 220 that when applied to data elements as stored in memory cells 310(a-n) based on word 330a thereby triggering each data element 370(a-n) to shift to the right and/or left results in the execution of a multiplication and/or division operation.

For example, corresponding control line 360a may drive memory cells 310(a-n) as identified by word 330a to execute the multiplication operation. In doing so, configurable processor controller 230 may select the combination of lookup bits 220 as stored in the corresponding function memory cells of configurable processor controller 230 to apply to data elements 370(*a-n*) as stored in memory cells 310(*a-n*) to shift each data element 370(*a-n*). In such an example, data element 370*a* of "1" as stored in memory cell 310*a* is shifted to memory cell 310*b*. Data element 370*b* of "0" as stored in memory cell 310*b* is shifted to memory cell 310*c*. Data element 370*c* of "1" as stored in memory cell 310*c* is shifted to memory cell 301*d*. Data element 370*d* of "1" as stored in memory cell 310*d* is shifted to memory cell 310*e*. Data element 370*e* of "1" as stored in memory cell 310*e* is shifted to memory cell 310*n* and so on. In doing so, the multiplication operation as required by control line 360*a* is executed. In applying the combination of lookup bits 220 to data elements 370(*a-n*) as stored in memory cells 310(*a-n*) to shift data elements 370(*a-n*) and thereby execute the multiplication operation, data elements 370(*a-n*) may then be adjusted as shift register and stored in memory cell register 320*b*.

Configurable processor controller 230 may store each data element in the corresponding function memory cell included in configurable processor controller 230 so that when each data element is applied to each data element 370(*a-n*) stored in each corresponding memory cell 310(*a-n*) included in dynamic memory block 135 each data element stored in each corresponding function memory cell included in configurable processor controller 230 operate as a one-bit adder to execute a multiplication operation. Configurable processor controller 230 may apply each one-bit adder as stored in each corresponding function memory cell included in configurable processor controller 230 to each corresponding memory cell 310(*a-n*) included in dynamic memory block 135 so that the multiplication operation is cascaded when corresponding memory cells 310(*a-n*) included in dynamic memory block 135 operate as a shift register to execute a shift and then each one-bit adder executes an add of each data element stored in each corresponding memory cell in 310(*a-n*) included in dynamic memory block 135 to execute the shift and the add thereby executing the multiplication operation.

For example, corresponding control line 360*a* may drive memory cells 310(*a-n*) as identified by word 330*a* to execute the multiplication operation. Configurable processor controller 230 may select the combination of lookup bits 220 as stored in the corresponding function memory cells of configurable processor controller 230 to apply to data elements 370(*a-n*) as stored in memory cells 310(*a-n*) such that each lookup bit 220 is applied to each data element 370(*a-n*) as a one-bit adder. Configurable processor controller 230 may then select a combination of lookup table bits 220 to apply to data elements 370(*a-n*) as stored in memory cells 310(*a-n*) such that each data element 370(*a-n*) is shifted. In doing so, the multiplication operation of each one-bit adder applied to each data element 370(*a-n*) is then cascaded with the shifting of each data element 370(*a-n*) to execute a shift and the add thereby executing the multiplication operation. In applying the combination of lookup bits 220 to data elements 370(*a-n*) as stored in memory cells as one-bit adders and then shifting each data element 370(*a-n*) to execute the shift and the add thereby executing the multiplication operation, data elements 370(*a-n*) may then be adjusted and stored in memory cell register 320*b*.

Configurable processor controller 320 may store each data element generated from the execution of the multiplication operation as a coefficient in a coefficient register. Configurable processor controller 320 may apply each data element stored in each corresponding coefficient memory cell included in the coefficient register with each data element stored in each corresponding memory cell 310(*a-n*) included in dynamic memory block 135 to execute a coefficient operation.

For example, corresponding control line 360*a* may drive memory cells 310(*a-n*) as identified by word 330*a* to execute the coefficient operation. Configurable processor controller 230 may select the combination of lookup bits 220 as stored in the corresponding function memory cells of configurable processor controller 230 to apply to data elements 370(*a-n*) as stored in memory cells 310(*a-n*) such that each lookup bit 220 is applied to each data element 370(*a-n*) to generate a 16-bit coefficient. The 16-bit coefficient may then be stored in memory cell register 320*c*. Configurable processor controller 230 may then select a combination of lookup table bits 220 to apply to data elements 370(*a-n*) as stored in memory cells 310(*a-n*) such that a 16-bit value as provided by data elements 370(*a-n*) as stored in memory cells 310(*a-n*) may then be multiplied with the 16-bit coefficient stored in memory cell register 320*c*.

In doing so, the coefficient operation may be executed thereby resulting in a 32-bit value as stored in memory cell register 320*n* resulting from the multiplication of the 16-bit coefficient value stored in memory cell register 320*c* with the incoming 16-bit value as provided by data elements 370(*a-n*) as stored in memory cells 310(*a-n*) via word 330*a*. In such an example, an infrared filter may be applied by simply meshing configurable processor controller 230 with dynamic memory block 135 in that 16-bit values may be multiplied together to generate 32-bit values. The meshing of configurable processor controller 230 with dynamic memory block 135 may enable the execution of computation operations such an addition, subtraction, multiplication, division, and/or any combination thereof that will be apparent to those skilled in the relevant art(s) without departing from the spirit and scope of the disclosure.

In addition to a filter application, the meshing of configurable processor controller 230 and dynamic memory block 135 may also be applied to a data search application. As discussed in detail above, the meshing of configurable processor controller 230 and dynamic memory block 135 may enable the execution of computation operations of multiplication, division, addition, and subtraction. Each of the numerous data elements 370(*a-n*) stored in the corresponding numerous memory cells 310(*a-n*) and segmented into numerous memory cell registers 320(*a-n*) may be encrypted into a database. By implementing DRAM into memory cells 310(*a-n*) a compare operation may be executed into order to search the numerous data elements 370(*a-n*) as stored in corresponding numerous memory cells 310(*a-n*) and encrypted into the database.

For example, the user may request to identify a data element 370(*a-n*) as included in a defined list of data elements 370(*a-n*). In such an example, the user may want to identify a name as provided in a list of addresses. Each of the names and corresponding addresses may be stored in a corresponding memory cell register 320(*a-n*). Configurable processor controller 230 may then pattern the lookup bits 220 such that the lookup bits 220 as stored in the function memory cells included in configurable processor controller 230 pattern the format in which the names and addresses are stored in corresponding memory cell registers 320(*a-n*) of dynamic memory block 135. The application of lookup bits 220 as stored in configurable processor memory 230 that pattern the formation in which the names and addresses are stored in corresponding memory cell registers of 320(*a-n*) of dynamic memory block 135 may then be compared to the names and addresses stored in corresponding memory cell registers 320(*a-n*).

In such an example, a range of one bit to 1000 bits or more may be stored in configurable processor controller 230 may be compared to the corresponding bits as stored in corresponding memory cell registers 320(*a-n*). In such an example, the first 10 bits as stored in configurable processor controller 230 as compared to the first 10 bits as stored in corresponding memory cell registers 320(*a-n*) may be associated with the address of where the person resides including the street number. The next 10 bits could be associated with the name of the person. The next 10 bits could be the date of birth of the person. In doing so, each sub word of bits associated to the address, the name, the date of birth as stored in configurable processor controller 230 may then be applied to the corresponding sub words of address, the name, the date of birth as segmented in the numerous memory cell registers 320(*a-n*) as included in dynamic memory block 135. A compare may then be applied to search the numerous memory cell registers 320(*a-n*) as stored in a database to identify the corresponding address, name, and date of birth as stored in numerous memory cell registers 320(*a-n*) to that of the address, name, and date of birth applied by configurable processor controller 230.

Rather than having to read each word 330(*a-n*) as stored in its entirety in corresponding memory cell register 320(*a-n*), additional functionality may be provided by configurable processor controller 230 such that sub words may be read from corresponding memory cell register 320(*a-n*). In doing so, the relevant terms stored in corresponding memory cell registers 320(*a-n*) may be pulled and stored and copied to be used in different iterations of computation operations by dynamic memory block 135. In order to engage particular sub words, input lines 240 may provide the appropriate control by configurable processor controller 230 to engage the particular sub words.

In doing so, configurable processor controller 230 may first print out the word that configurable processor controller 230 requests to search via input lines 240. The appropriate bit lines 340(*a-n*) and word lines 330(*a-n*) may then be activated based on the appropriate control signal 360(*a-n*) to activate the particular sub word included in the corresponding memory cell register 320(*a-n*). Then, the data elements 370(*a-n*) stored in the corresponding memory cells 310(*a-n*) that have been activated based on the corresponding bit lines 340(*a-n*) and the corresponding word lines 330(*a-n*) that have been activated may be flushed out and stored in an additional memory cell register 320(*a-n*). Rather than activating each memory cell 310(*a-n*) that is included in the appropriate sub word one by one in sequence in that each corresponding data element 370(*a-n*) is read one by one in sequence, each memory cell 310(*a-n*) included the appropriate sub word is activated simultaneously and each corresponding data element 370(*a-n*) is read simultaneously. Thus, the particular sub word may be read and identified.

For example, rather than having to read the entire word 330*a* that includes data elements 370(*a-n*) as stored in corresponding memory cells 310(*a-n*) and included in memory cell register 320*b*, a sub word may be read from memory cell register 320*b*. In such an example, configurable processor controller 230 may request the sub word that is to be read via input lines 240. In doing so, configurable processor controller 230 may segment memory cells 310(*a-n*) as included in memory cell register 320*b* that are to be read to include memory cells 310(*a-c*) thereby identifying that the sub word read from memory cell register 320*b* be segmented to include memory cells 310(*a-c*) rather than including all of the memory cells 310(*a-n*) as included in memory cell register 320*b*. In configurable processor controller 230 requesting the sub word of memory cells 310(*a-c*), bit lines 340(*a-d*) and word lines 330*a* and 330*b* may be activated. The activation of bit lines 340(*a-d*) and word lines 330*a* and 330*b* thereby activates memory cells 310(*a-c*) and represents the sub word included in memory cell register 320*b*. Then, data element 370*a* of "1", data element 370*b* of "0", and data element 370*c* of "1" stored in corresponding memory cells 310(*a-c*) may be flushed out and stored in an additional memory cell register 320*n*. In doing so, each memory cell 310(*a-c*) that is included in the sub word are activated simultaneously triggering each corresponding data element 370*a* of "1", data element 370*b* of "0" and data element 370*c* of "1" to be read simultaneously as opposed to being activated and thereby read in sequence.

In a text based application, a pixel may be stored as a word, such as word 330*a*. In order to access the pixel data associated with the pixel, the appropriate bit lines 340(*a-n*) and word lines 330(*a-n*) may be activated and the appropriate vector components and vertex components associated with the pixel may be identified. In doing so, each word may have a read component 390 and a written component 395. For example, memory cell register 320*b* may be identified by word 330*a* and 330*b* as read component 390 and memory cell register 320*c* may be identified by word 330*b* and 330*c* as write component 395. In order to activate read component 390, bit lines 340(*a-n*) may be activated as well as word lines 330*a* and 330*b*. In order to activate write component 395, bit lines 340(*a-n*) may be activated as well as word lines 330*b* and 330*c*. Thus, each word 330(*a-n*) is actually a read and a write such that either a read component 390 is activated and/or a written component 395 is activated.

In a graphics based application, each pixel stored in dynamic memory block 135 may be identified by configurable processor controller 230 based on how the pixel relates to the polygon that stores the pixel. The scene may be viewed in that the pixel as depicted by the polygon is selected out of the scene. Configurable processor controller 230 may then determine the polygon that the selected pixel is included. Configurable processor controller 230 may then store the associated data as data elements in the corresponding function memory cells included in configurable processor controller 230.

As the polygon that includes the pixel is moved throughout the scene and corresponding data is stored by memory cells 310(*a-n*) included in dynamic memory block 135, configurable processor controller 230 may then maintain how the pixel is moved relative to the polygon throughout the scene as the data stored in memory cells 310(*a-n*) continues to change pixel is moved relative to the scene. In doing so, the pixel may be identified regardless as to how the pixel and/or polygon move throughout the scene based on the configurable processor controller 230 maintaining how the pixel relates to the polygon and dynamic memory block 135 dynamically changing as the pixel moves throughout the scene.

The meshing of configurable processor controller 230 and dynamic memory 135 may be incorporated into filter applications, encryption applications, text based applications, graphic based applications, searching applications, and/or any other type of application in that configurable processor controller 230 may be applied to dynamic memory 135 such that dynamic memory 135 may execute computation operations that will be apparent to those skilled in the relevant art(s) without departing from the spirit and scope of the disclosure.

The foregoing description of the specific embodiments will fully reveal the general nature of the present invention that others may, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on teaching and guidance presented herein. It is to be understood that the phraseology or terminology herein is for the purpose of description and not limitation, such that the terminology or phraseology of the specification is to be interpreted by the skilled artisan in light of the teachings and guidance.

The breadth and scope of the present invention should not be limited by any of the above-described exemplary embodiments, but should be defined only in accordance with the claims and their equivalence.

What is claimed is:

1. A system that incorporates a dynamic memory block and a configurable processor controller to enable computational processing and memory storage via the dynamic memory block and the configurable processor controller, comprising:
    a plurality of memory cells included in the dynamic memory block configured to:
        store a plurality of data elements with each data element stored in a corresponding memory cell, and
        execute a computation operation when the storage of the data elements is adjusted thereby triggering the computation operation and enabling the memory cells to function as a memory storage device and a computation device; and
    a configurable processor controller configured to:
        transition the memory cells from the memory storage device to the computation device by adjusting the storage of data elements by the memory cells to execute the computation operation,
        determine a combination of lookup table bits included in a lookup table that represents a function designated to be executed by the memory cells included in the dynamic memory block by a corresponding address,
        apply the combination of lookup table bits to each data element stored in each corresponding memory cell included in the dynamic memory block that is designated to execute the function thereby adjusting each data element to correspond to the combination of lookup table bits that represents the function,
        execute the function by the dynamic memory block with the adjusted data element in each corresponding memory cell based on the combination of lookup table bits that represents the function, and
        transition the memory cells from the computation device to the memory storage device by maintaining the storage of data elements by the memory cells in a static state thereby preventing storage of data elements by the memory cells from being adjusted.

2. The system of claim 1, wherein the configurable processor controller is further configured to store a plurality of data elements with each data element stored in a corresponding function memory cell from a plurality of function memory cells included in the configurable processor controller.

3. The system of claim 2, wherein the configurable processor controller is further configured to:
    apply each data element stored in each corresponding function memory cell included in the configurable processor controller to each data element stored in each corresponding memory cell included in the dynamic memory block via a plurality of input lines; and
    adjust each data element stored in each corresponding memory cell included in the dynamic memory block with the corresponding data element in each corresponding function memory cell included in the configurable processor controller.

4. The system of claim 3, wherein the configurable processor controller is further configured to:
    store each data element in each corresponding function memory cell included in the configurable processor controller so that when each data element is applied to each data element stored in each corresponding memory cell included in the dynamic memory block executes a Boolean function; and
    apply the Boolean function to the memory cells included in the dynamic memory block by applying each data element stored in each corresponding function memory cell included in the configurable processor controller to each data element stored in each corresponding memory cell included in the dynamic memory block to execute the Boolean function.

5. The system of claim 3, wherein the configurable processor controller is further configured to:
    receive from an address multiplexor an address via a control line that designates that a corresponding block of memory cells is to execute an addition operation function as identified by the corresponding address, wherein a plurality of bit lines as positioned vertically across a memory block and a plurality of word lines positioned across the memory block partition a block of memory cells that is designated to execute the addition operation function identified by the corresponding address;
    determine a combination of lookup table bits included in a lookup table that represents the addition operation function designated to be executed by the block of memory cells by the corresponding address;
    apply the combination of lookup table bits that represents the addition operation function to each data element stored in each corresponding memory cell included in the block of memory cells that is designated to execute the addition operation function via a bit signal to adjust a binary value of each data element to correspond to the combination of lookup table bits that represents the addition operation function;
    store the adjusted binary value of each data element in each corresponding memory cell included in the configurable processor controller based on the combination of lookup table bits as included in the lookup table that represents the addition operation function so that in response to each corresponding memory cell applying each stored data element corresponds to the addition operation function that is designated to be executed by the block of memory cells as identified by the corresponding address;
    and execute the addition operation function by the block of memory cells with the adjusted binary value of each data element in each corresponding memory cell of the block of memory cells based on the combination of lookup table bits that represents the addition operation function.

6. The system of claim 3, wherein the configurable processor controller is further configured to:
apply each data element in each corresponding function memory cell included in the configurable processor controller so that when each data element is applied to each data element stored in each corresponding memory cell included in the dynamic memory block each data element stored in each corresponding memory cell included in the dynamic memory block is shifted thereby executing a multiplication operation.

7. The system of claim 6, wherein the configurable processor controller is further configured to:
store each data element in each corresponding function memory cell included in the configurable processor controller so that when each data element is applied to each data element stored in each corresponding memory cell included in the dynamic memory block each data element stored in each corresponding function memory cell included in the configurable processor controller to execute a multiplication operation;
execute the multiplication operation to cascade the multiplication when the corresponding memory cells included in the dynamic memory block operate as a shift register to execute a shift and then an addition operation of each data element stored in each corresponding memory cell included in the dynamic memory block is executed to execute the shift and the add thereby executing the multiplication operation.

8. The system of claim 6, wherein the configurable processor controller further configured to:
store each data element generated from the execution of the multiplication operation as a coefficient in a coefficient register; and
apply each data element stored in each corresponding coefficient memory cell included in the coefficient register with each data element stored in each corresponding memory cell included in the dynamic memory block to execute a coefficient operation.

9. The system of claim 3, wherein the configurable processor controller is a Field Programmable Gate Array (FPGA).

10. The system of claim 9, wherein the configurable processor controller includes the lookup table included in the FPGA and each data element stored in the lookup table is applied to each corresponding data element stored in each corresponding function memory cell included in the dynamic memory block to trigger the computation operation of the dynamic memory block.

11. A method that incorporates a dynamic memory block and a configurable processor controller to enable computational processing and memory storage via the dynamic memory block and the configurable processor controller, comprising:
storing, by a plurality of memory cells, a plurality of data elements with each data element stored in a corresponding memory cell;
executing, by the dynamic memory block, a computation operation in response to the storage of the data elements is adjusted thereby triggering the computation operation and enabling the memory cells to function as a memory storage device and a computation device;
transitioning, by the configurable processor controller, the memory cells from the memory storage device to the computation device by adjusting the storage of data elements by the memory cells to execute the computation operation;
determining a combination of lookup table bits included in a lookup table that represents a function designated to be executed by the memory cells included in the dynamic memory block by a corresponding address;
applying the combination of lookup table bits to each data element stored in each corresponding memory cell included in the dynamic memory block that is designated to execute the function thereby adjusting each data element to correspond to the combination of lookup table bits that represents the function;
execute the function by the dynamic memory block with the adjusted data element in each corresponding memory cell based on the combination of lookup table bits that represents the function; and
transitioning, by the configurable processor controller, the memory cells from the computation device to the memory storage device by maintaining the storage of data elements by the memory cells in a static state thereby preventing storage of data elements by the memory cells from being adjusted.

12. The method of claim 11, further comprising:
storing, by the configurable processor controller, a plurality of data elements with each data element stored in a corresponding function memory cell from a plurality of function memory cells included in the configurable processor controller.

13. The method of claim 12, further comprising:
applying, by the configurable processor controller, each data element stored in each corresponding function memory cell included in the configurable processor controller to each data element stored in each corresponding memory cell included in the dynamic memory block via a plurality of input lines;
adjusting each data element stored in each corresponding memory cell included in the dynamic memory block with the corresponding data element in each corresponding function memory cell included in the configurable processor controller; and
triggering the computation operation by the memory cells included in the dynamic memory block with the adjustment of each data element stored in each corresponding memory cell included in the dynamic memory block with the corresponding data element in each corresponding function memory cell included in the configurable processor controller applied by the configurable processor controller via the plurality of input lines.

14. The method of claim 13, further comprising:
storing each data element in each corresponding function memory cell included in the configurable processor controller so that in response to each data element is applied to each data element stored in each corresponding memory cell included in the dynamic memory block executes a Boolean function; and
applying the Boolean function to the memory cells included in the dynamic memory block by applying each data element stored in each corresponding function memory cell included in the configurable processor controller to each data element stored in each corresponding memory cell included in the dynamic memory block to execute the Boolean function.

15. The method of claim 13, further comprising:
receiving from an address multiplexor an address via a control line that designates that a corresponding block of memory cells is to execute an addition operation function as identified by the corresponding address, wherein a plurality of bit lines as positioned vertically across a memory block and a plurality of word lines positioned across the memory block partition a block of memory cells that is designated to execute the addition operation function identified by the corresponding address;

determining a combination of lookup table bits in a lookup table that represents the addition operation function designated to be executed by the block of memory cells by the corresponding address;

applying the combination of lookup table bits that represents the addition operation function to each data element stored in each corresponding memory cell included in the block of memory cells that is designated to execute the addition operation function via a bit signal to adjust a binary value of each data element to correspond to the combination of lookup table bits that represents the addition operation function;

storing the adjusted binary value of each data element in each corresponding function memory cell included in the configurable processor controller based on the combination of lookup table bits as included in the lookup table that represents the addition operation function so that in response to corresponding memory cell applying each stored data element corresponds to the addition operation function that is designated to be executed by the block of memory cells identified by the corresponding address and executing the addition operation function by the block of memory cells with the adjusted binary value of each data element in each corresponding memory cell of the memory block based on the combination of lookup table bits that represents the addition operation function.

16. The method of claim 13, further comprising:
applying each data element in each corresponding function memory cell included in the configurable processor controller so that in response to each data element is applied to each data element stored in each corresponding memory cell included in the dynamic memory block each data element stored in each corresponding memory cell included in the dynamic memory block is shifted thereby executing a multiplication operation.

17. The method of claim 16, further comprising:
storing each data element in each corresponding function memory cell included in the configurable processor controller so that in response to each data element is applied to each data element stored in each corresponding memory cell included in the dynamic memory block each data element stored in each corresponding function memory cell included in the configurable processor controller operate as a one-bit adder to execute a multiplication operation; and applying each one-bit adder as stored in each corresponding function memory cell included in the configurable processor controller to each corresponding memory cell included in the dynamic memory block so that the multiplication operation is cascaded when the corresponding memory cells included in the dynamic memory block operate a shift register to execute a shift and then each one-bit adder executes an add of each data element stored in each corresponding memory cell included in the dynamic memory block to execute the shift and the add thereby executing the multiplication operation.

18. The method of claim 16, further comprising:
storing each data element generated from the execution of the multiplication operation as a coefficient in a coefficient register; and applying each data element stored in each corresponding memory cell included in the coefficient register with each data element stored in each corresponding memory cell included in the dynamic memory block to execute a coefficient operation.

19. The method of claim 13, wherein the configurable processor controller is a Field Programmable Gate Array (FPGA).

20. The method of claim 19, wherein the configurable processor controller includes the lookup table included in the FPGA and each data element stored in the lookup table is applied to each data element stored in each corresponding function memory cell included in the dynamic memory block to trigger the computation operation of the dynamic memory block.

* * * * *